(12) United States Patent
Masuda

(10) Patent No.: US 7,601,279 B2
(45) Date of Patent: Oct. 13, 2009

(54) ORGANIC SEMICONDUCTOR COMPOSITION CONTAINING CIS-DECALIN

(75) Inventor: Takashi Masuda, Suwa (JP)

(73) Assignee: Seiko Epson Corporation, Tokyo (JP)

(*) Notice: Subject to any disclaimer, the term of this patent is extended or adjusted under 35 U.S.C. 154(b) by 491 days.

(21) Appl. No.: 11/567,537

(22) Filed: Dec. 6, 2006

(65) Prior Publication Data

US 2007/0145324 A1    Jun. 28, 2007

(30) Foreign Application Priority Data

Dec. 27, 2005 (JP) .............................. 2005-376311
Oct. 20, 2006 (JP) .............................. 2006-286722

(51) Int. Cl.
*H01B 1/12* (2006.01)

(52) U.S. Cl. ..................................................... 252/500
(58) Field of Classification Search ................. 252/500; 528/377

See application file for complete search history.

(56) References Cited

U.S. PATENT DOCUMENTS 5,171,632 A * 12/1992 Heeger et al. ................ 428/364
2005/0067949 A1* 3/2005 Natarajan et al. ............ 313/504
2009/0093588 A1* 4/2009 Akutsu et al. ................ 524/612

FOREIGN PATENT DOCUMENTS

JP        A 2004-6782       1/2004

* cited by examiner

*Primary Examiner*—Mark Kopec
(74) *Attorney, Agent, or Firm*—Oliff & Berridge, PLLC

(57) ABSTRACT

An organic semiconductor composition comprises: an organic semiconductor material having a structural unit including at least one thiophene ring as a repeating unit; and an organic solvent including cis-decalin.

11 Claims, 8 Drawing Sheets

ORGANIC SEMICONDUCTOR COMPOSITION CONTAINING CIS-DECALIN

BACKGROUND

1. Technical Field

The present invention relates to a method for manufacturing an organic semiconductor composition and a transistor, a method for manufacturing an active matrix device, a method for manufacturing an electro optical device and a method for manufacturing an electronic apparatus.

2. Related Art

JP-A-2004-6782 discloses a thin-film transistor formed with an organic semiconductor material, which has recently attracted attention as a device being replaced with a thin-film transistor formed with an inorganic semiconductor material.

As an organic semiconductor material for this thin-film transistor, a polymer organic semiconductor material having thiophene ring is known. The organic semiconductor material provides high carrier mobility and allows an organic semiconductor layer to be formed by a liquid phase process since the polymer can dissolve into an organic solvent to be used as ink.

In the liquid phase process, ink including an organic semiconductor material is applied to a predetermined region for an organic semiconductor layer, followed by a necessary treatment to form the organic semiconductor layer.

Here, property of ink is important to apply the ink evenly and prevent each organic semiconductor layer to be formed from varying.

That is, ink needs to have a property in which the organic semiconductor material therein is hard to be precipitated and have superior stability. Further, in accordance with ink application methods, ink needs to have well-adjusted surface tension, viscosity and boiling point within an appropriate range.

However, the organic semiconductor material having thiophene ring is easy to aggregate centering around the thiophene ring with time when it dissolves in an organic solvent. Due to this aggregation, the organic semiconductor material is precipitated, making it hard to obtain stable ink.

SUMMARY

The advantage of the invention is to provide an organic semiconductor composition that can form an organic semiconductor layer having high preservation stability and superior characteristics, a method for manufacturing a transistor providing the transistor with high reliability using the organic semiconductor composition, a method for manufacturing an active matrix device, a method for manufacturing an electro optical device and a method for manufacturing an electronic apparatus.

Now, aspects of the present invention are described below.

The organic semiconductor composition according to a first aspect of the invention includes an organic semiconductor material having a structural unit including at least one thiophene ring as a repeating unit, and an organic solvent including cis-decalin.

The organic semiconductor composition to form an organic semiconductor layer with high preservation stability and superior characteristics is thus obtained.

In the organic semiconductor composition, the organic solvent preferably includes 15 wt % or more of cis-decalin.

The organic semiconductor composition becomes thus stable sufficiently.

In the organic semiconductor composition, the organic solvent further preferably includes a substance whose second virial coefficient to the organic semiconductor material is smaller than that of cis-decalin.

Therefore, when the repeating unit in the organic semiconductor material includes an alkyl chain, the alkyl chain contracts, preventing steric hindrance between adjacent alkyl chains and improving planarity of the molecule structure and the packing density between molecules. As a result, carrier mobility of the organic semiconductor layer can be increased.

In the organic semiconductor composition, the substance is preferably trans-decalin.

Trans-decalin has a smaller virial coefficient to the organic semiconductor material than that of cis-decalin, and high compatibility with cis-decalin. Therefore, stability of the organic semiconductor composition is maintained for a long period of time while crystalline of the organic semiconductor layer is increased, improving carrier mobility.

In the organic semiconductor composition, a volume ratio of cis-decalin to trans-decalin in the organic solvent is preferably from 3:7 to 7:3.

Therefore, stability of the organic semiconductor composition is more highly maintained for a long period of time, particularly improving carrier mobility.

In the organic semiconductor composition, the structural unit preferably includes a Π conjugated structure on a main chain.

The Π conjugated structure can prevent decrease of carrier mobility of molecules caused by inclusion of other structures than the one including at least one thiophene ring into the structural unit. Thereby, the carrier mobility of the organic semiconductor layer is prevented from decreasing.

In the organic semiconductor composition, the Π conjugated structure is preferably fluorine ring.

Fluorine ring has especially high carrier mobility. Therefore, prevention of decreasing carrier mobility caused by fluorine ring is particularly ensured.

In the organic semiconductor composition, the structural unit preferably includes an alkyl chain bound to the fluorine ring.

Accordingly, at least binding the alkyl chains to thiophene ring is avoided, maintaining the structure of thiophene ring. Therefore, semiconductor characteristics of thiophene ring are certainly prevented from decreasing.

In the organic semiconductor composition, the structural unit preferably includes an alkyl chain.

Affinity to a general organic solvent is thus increased, improving solubility of the organic semiconductor material to the organic solvent.

For the organic semiconductor composition, the alkyl chain preferably includes a carbon number of from about 4 to about 20.

Accordingly, solubility of the organic semiconductor material to the organic solvent is maintained sufficiently.

In the organic semiconductor composition, the organic semiconductor material preferably includes from about 2 to about 500 of the repeating units.

The organic semiconductor material can thus show sufficient characteristics as a semiconductor material while synthesizing and handling thereof are facilitated.

The organic semiconductor composition preferably includes 0.1 wt % to 5 wt % of the organic semiconductor material.

Accordingly, the organic semiconductor material is certainly prevented from precipitating while an organic semiconductor layer having a sufficient film thickness is formed.

A method for manufacturing a transistor having a source electrode, a drain electrode, a gate electrode, an organic semiconductor layer, a gate insulation layer insulating the source electrode and the drain electrode from the gate electrode according to a second aspect of the invention includes forming the organic semiconductor layer by applying an organic semiconductor composition including an organic semiconductor material having a structural unit including at least one thiophene ring as a repeating unit and an organic solvent including cis-decalin.

The transistor having superior transistor characteristics and durability as well as high reliability is obtained.

According to a third aspect of the invention, a method for manufacturing an active matrix device employs the method for manufacturing a transistor.

The active matrix device with high reliability can be thus provided.

According to a fourth aspect of the invention, a method for manufacturing an electro optical device employs the method for manufacturing an active matrix device.

The electro optical device with high reliability can be thus provided.

According to a fifth aspect of the invention, a method for manufacturing an electronic apparatus employs the method for manufacturing an electro optical device.

The electronic apparatus with high reliability can be thus provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Exemplary embodiments of the invention with respect to a method for manufacturing an organic semiconductor composition and a transistor, a method for manufacturing an active matrix device, a method for manufacturing an electro optical device and a method for manufacturing an electronic apparatus will be described with accompanying drawings.

First Embodiment

A first embodiment of a thin-film transistor manufactured by using an organic semiconductor composition of the invention is now explained.

Figure 1A:
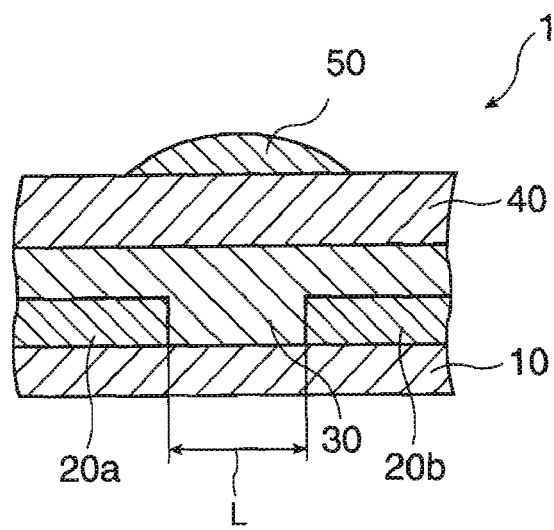
FIGS. 1A and 1B are schematic views of a first embodiment of a thin-film transistor manufactured by using an organic semiconductor composition of the invention.
Figure 1B:
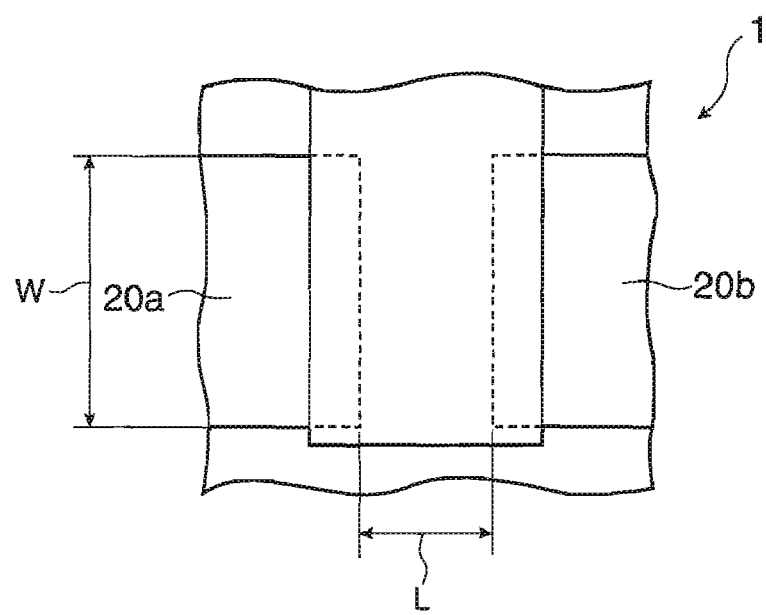

FIGS. 1A and 1B are schematic views showing the first embodiment of a thin-film transistor manufactured by using the organic semiconductor composition. FIG. 1A is a cross sectional view and FIG. 1B is a plain view. FIGS. 2A, 2B, 3C, and 3D are cross sectional views for explaining a method for manufacturing the thin-film transistor shown in FIGS. 1A and 1B. FIGS. 4A and 4B are schematic views showing three-dimensional structures of cis-decalin and trans-decalin.

A thin-film transistor 1 (the transistor of the invention) in FIGS. 1A and 1B is a top gate type thin-film transistor formed on a substrate 10, including a source electrode 20$a$, a drain electrode 20$b$, an organic semiconductor layer 30, a gate electrode 50 and a gate insulation layer 40. The source electrode 20$a$ is separated from the drain electrode 20$b$. The organic semiconductor layer 30 is formed covering over the source electrode 20$a$ and the drain electrode 20$b$. The gate insulation layer 40 is located between the organic semiconductor layer 30 and the gate electrode 50.

Each element will now be described in detail.

The substrate 10 supports each layer (each element) making up the thin-film transistor 1.

Examples of the material of the substrate 10 include a glass substrate; a plastic substrate (resin substrate) containing polyethylene terephthalate (PET), polyethylene naphthalate (PEN), polyethersulphone (PES), aromatic polyester (liquid crystal polymer), polyimide (PI), or the like; a quartz substrate; a silicon substrate; a metal substrate; and a gallium arsenide substrate.

In order to provide flexibility to the thin-film transistor 1, the substrate 10 can be a plastic substrate or a thin metal substrate whose thickness is comparatively small.

A pair of electrodes (the source electrode 20$a$ and the drain electrode 20$b$) is formed on the substrate 10. Namely, the source electrode 20$a$ and the drain electrode 20$b$ are formed to be approximately flush with each other on the surface.

As the materials for the source electrode 20$a$ and the drain electrode 20$b$, metal materials such as Au, Ag, Cu, Pt, Ni, Cr, Ti, Ta, and Al or an alloy including these metals, and an oxide thereof or the like are cited.

Namely, the source electrode 20$a$ and the drain electrode 20$b$ can be made of a conductive organic material.

When the organic semiconductor layer 30 is P type, it is preferable that a material for the source electrode 20$a$ and the drain electrode 20$b$ mainly include Au, Ag, Cu, Pt, or an alloy including these metals, These metals have a relatively-high working function, improving injection efficiency of holes (carriers) into the organic semiconductor layer 30 if the source electrode 20$a$ is made of one of these metals.

The average thickness of the source electrode 20$a$ and the drain electrode 20$b$ is not particularly limited. However, it is preferably from about 10 nm to about 2000 nm, and more preferably from about 50 nm to about 1000 nm.

The distance between the source electrode 20$a$ and the drain electrode 20$b$, namely a channel length L shown in FIGS. 1A and 1B, is preferably from about 2 μm to about 30 μm, more preferably from about 2 μm to about 20 μm. Setting the value of the channel length L in the above ranges improves the characteristics of the thin-film transistor 1 (increase of ON current in particular).

Further, the length of the source electrode 20$a$ and the drain electrode 20$b$, namely a channel width W shown in FIG. 1B is preferably from about 0.1 to about 5 mm, more preferably from about 0.3 to about 3 mm. Setting the value of the channel width W in the above ranges reduces parasitic capacitance, preventing the characteristics of the thin-film transistor 1 from deteriorating. Further, the thin-film transistor 1 can be downsized.

The organic semiconductor layer 30 is formed on the substrate 10, contacting each of the source electrode 20a and the drain electrode 20b.

A material for the organic semiconductor layer 30 will be described in the method for manufacturing a thin-film transistor later.

The average thickness of the organic semiconductor layer 30 is not particularly limited. However, it is preferably from about 0.1 nm to about 1000 nm, more preferably from about 1 nm to about 500 nm, and further preferably from about 1 nm to about 100 nm.

The gate insulation layer (an insulation layer) 40 is formed on the organic semiconductor layer 30, namely a side opposite to the source electrode 20a and the drain electrode 20b via the organic semiconductor layer 30.

The gate insulation layer 40 insulates the gate electrode (a third electrode) 50, which is described later, from the source electrode 20a and the drain electrode 20b.

A type of materials for the gate insulation layer 40 is not limited. Any organic and inorganic materials can be used as long as they are known as gate insulating materials.

As organic materials, polymethyl methacrylate, polyvinyl phenol, polyimide, polystyrene, polyvinyl alcohol, polyvinyl acetate are cited. They can be used singly or in combination of two or more of them.

As inorganic materials, metal oxides such as silica, silicon nitride, aluminum oxide, tantalum oxide, metal compound oxides such as barium strontium titanate, lead zirconate titanate are cited. They can be used singly or in combination of two or more of them.

The average thickness of the gate insulation layer 40 is not limited. However, it is preferably from about 10 nm to about 5000 nm, and more preferably from about 100 nm to about 2000 nm. The gate insulation layer 40 having the thickness within the above ranges can certainly insulate the gate electrode 50 from the source electrode 20a and the drain electrode 20b, and lower the operating voltage of the thin-film transistor 1.

The gate insulation layer 40 is not limited to a single layer, but may be a multiple layered structure.

The gate electrode 50 applying an electric field to the organic semiconductor layer 30 is provided on a specific position on the gate insulation layer 40, namely, corresponding to a region between the source electrode 20a and the drain electrode 20b.

Materials of the gate electrode 50 are not specifically limited as long as they are known as electrode materials. Specifically, Cr, Al, Ta, Mo, Nb, Cu, Ag, Au, Pd, In, Ni, Nd, Co, or metal materials such as alloys including these elements, and these oxides are used.

Alternatively, conductive organic materials may be used for the gate electrode 50.

The average thickness of the gate electrode 50 is not specifically limited. However, it is preferably from about 0.1 nm to about 2000 nm, and more preferably from about 1 nm to about 1000 nm.

With a voltage applied in between the source electrode 20a and the drain electrode 20b of the thin-film transistor 1, applying a gate voltage to the gate electrode 50 makes a channel in the organic semiconductor layer 30 near the interface with the gate insulation layer 40. As carriers (holes) move in this channel region, a current flows between the source electrode 20a and the drain electrode 20b.

More specifically, when a voltage is applied in between the source electrode 20a and the drain electrode 20b with no voltages being applied to the gate electrode 50, namely OFF state, only a small amount of current flows, since there are few carriers in the organic semiconductor layer 30.

On the other hand, when a voltage is applied to the gate electrode 50, namely ON state, electric charges are induced to a region where the organic semiconductor layer 30 faces the gate insulation layer 40 to form a channel (a path for carriers). Under this state, if a voltage is applied in between the source electrode 20a and the drain electrode 20b, a current flows through the channel.

Next, the organic semiconductor composition of the embodiment is explained by exemplifying a case of manufacturing the thin-film transistor shown in FIGS. 1A and 1B.

The method for manufacturing the thin-film transistor 1 shown in FIGS. 1A and 1B includes a step [A1] for forming the source electrode 20a and the drain electrode 20b on the substrate 10, a step [A2] for forming the organic semiconductor layer 30 with covering over the source electrode 20a and the drain electrode 20b, a step [A3] for forming the gate insulation layer 40 on the organic semiconductor layer 30, and a step [A4] for forming the gate electrode 50 on the gate insulation layer 40.

[A1] Step for Forming the Source Electrode and the Drain Electrode

Figure 2A:
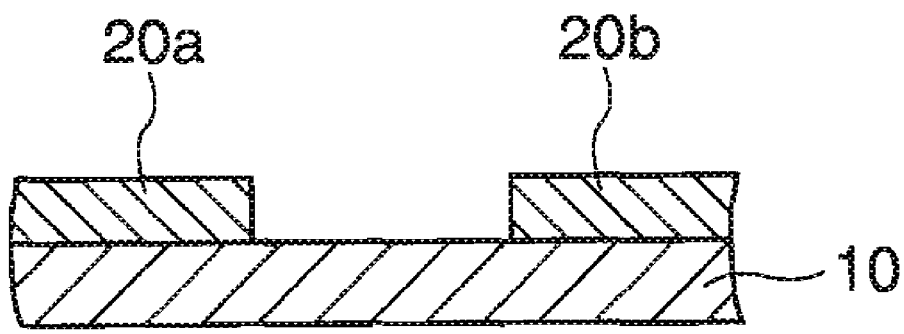
FIGS. 2A and 2B are cross sectional views explaining a method for manufacturing the thin-film transistor shown in FIGS. 1A and 1B.

First, the source electrode 20a and the drain electrode 20b are formed on the substrate 10 (see FIG. 2A).

The source electrode 20a and the drain electrode 20b are formed by etching or a lift off method.

In the case of forming the source electrode 20a and the drain electrode 20b by etching, a metal film (a metal layer) is deposited over the all surface of the substrate 10 by sputtering, evaporation or plating. Next, a photo resist layer is deposited on the metal film (the surface) by using photolithography, microcontact printing, for example. Then, the metal film is etched and patterned to have a specific pattern by using the resist layer as a mask.

In the case of forming the source electrode 20a and the drain electrode 20b by a lift off method, a resist layer is firstly formed over a region except the regions where the source electrode 20a and the drain electrode 20b are formed. Next, a metal film (a metal layer) is deposited on the all surface of the substrate 10 on the resist layer side by using evaporation and plating. Then, the resist layer is removed.

The source electrode 20a and the drain electrode 20b may be formed on the substrate 10 by applying (or providing) conductive particles or a conductive material containing a conductive organic material, and then providing a necessary treatment (e.g. heating, irradiation of infrared rays, application of ultrasonic waves) to this coated film.

As the conductive material containing conductive particles, solutions in which metal micro particles are dispersed and polymer mixtures containing conductive particles are cited.

Examples of the conductive material containing a conductive organic material include a solution or dispersion liquid of the conductive organic material.

The conductive material can be applied (or provided) on the substrate 10 by the following coating methods, for example; a coating method such as spin coating, casting, micro gravure coating, gravure coating, bar coating, roll coating, wire-bar coating, dip coating, spray coating, and a printing method such as screen printing, flexographic printing, offset printing, and inkjet printing, micro contact printing.

They can be used singly or in combination of two or more of them. As the organic material, polymethyl methacrylate, polyvinyl phenol, polyimide, polystyrene, polyvinyl alcohol, polyvinyl acetate are cited. They can be used singly or in combination of two or more of them.

[A2] Step for Forming the Organic Semiconductor Layer

Figure 2B:
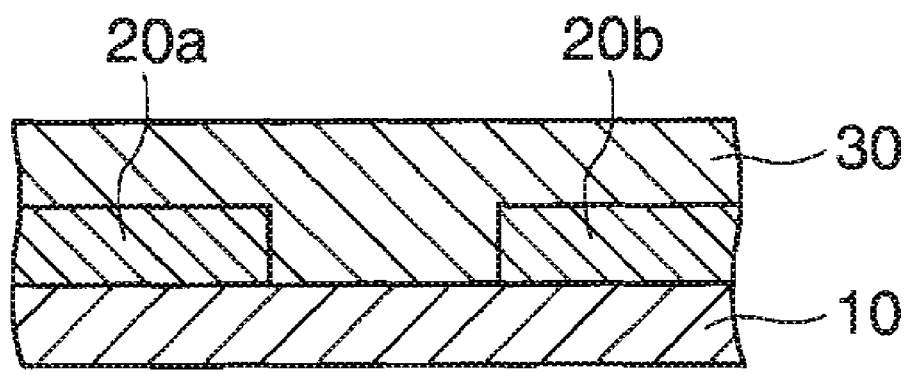

Next, the organic semiconductor layer 30 is formed covering over the source electrode 20a and the drain electrode 20b (see FIG. 2B).

The organic semiconductor layer 30 is provided covering over the source electrode 20a and the drain electrode 20b with the organic semiconductor composition including the organic semiconductor material and the organic solvent. Then, a necessary treatment to form the organic semiconductor layer 30 can be followed if required.

First, the organic semiconductor composition including the organic semiconductor material and the organic solvent is prepared.

As the organic semiconductor material, an organic semiconductor material whose structural unit including at least one thiophene ring (hereinafter simply referred to as "structural unit") is a repeating unit can be used. Such an organic semiconductor material can obtain high carrier mobility as the thiophene ring has a Π conjugated system. Accordingly, the thin-film transistor having superior characteristics can be manufactured using this organic semiconductor material.

However, the organic semiconductor material whose structural unit including at least one thiophene ring is easy to aggregate centering around the thiophene ring. Therefore, in such an organic semiconductor composition made by dissolving the organic semiconductor material into the organic solvent, the organic semiconductor material is precipitated due to aggregation centering around the thiophene ring as time passes, making it unstable to be stored. Therefore, the organic semiconductor composition is hard to use for the organic semiconductor layer forming. Even if it is used for the organic semiconductor layer forming, characteristics vary widely depending on the organic semiconductor layers formed.

The inventor devoted himself to enable such an organic semiconductor composition to be stably stored for a long period. As a result, he found effectiveness of using an organic solvent including cis-decalin (cis-decahydronaphthalene) as an organic solvent to dissolve the organic semiconductor material stated above, successfully completing the invention.

Cis-decalin here is a type of geometric isomers of decalin (decahydronaphthalene). Cis-decalin has a unique three-dimensional structure as shown in FIG. 4A and large steric hindrance compared to common organic solvents. When the organic semiconductor material whose structural unit is a repeating unit including at least one thiophene ring is dissolved to the organic solvent including cis-decalin having the unique three-dimensional structure, interference (steric hindrance) of cis-decalin prevents the organic semiconductor material from aggregating by centering around the thiophene ring and being precipitated. Consequently, the organic semiconductor composition being stable over a long period of time is obtained.

Further, the thin-film transistor 1 manufactured by using such a stable organic semiconductor composition, preventing each of the characteristics from varying. As a result, an electronic apparatus such as a display device described later in which a thin-film transistor such as the thin-film transistor 1 is incorporated has improved reliability.

In the organic semiconductor composition, the organic solvent preferably includes 15 wt % or more of cis-decalin. The organic semiconductor composition becomes thus sufficiently stable.

Further, in general, a molecule composing the organic semiconductor layer preferably has a molecule structure having high planarity. Accordingly, the conjugation length of the molecule becomes long, and interaction between molecules becomes strong, improving crystalline of the organic semiconductor layer. As a result, carrier mobility of the organic semiconductor layer can be improved.

Here, the organic semiconductor material preferably includes an alkyl chain. This makes affinity to a general organic solvent increased, improving solubility of the organic semiconductor material to the organic solvent. In this case, when steric hindrance of the alkyl chain included in the organic semiconductor material is lowered, the planarity of the molecule structure and packing density between molecules are improved as described above. The alkyl chain has a property to be elastic corresponding to a second virial coefficient (solubility) to the organic semiconductor material in the organic solvent when the organic semiconductor material is dispersed or dissolved into the organic solvent. The second virial coefficient can be an index showing a level of interaction of the organic semiconductor material that is a solute in the organic solvent.

Specifically, when the second virial coefficient is positive, namely when the organic solvent is a good solvent to the organic semiconductor material, the alkyl chain extends, while the second virial coefficient is negative, namely when the organic solvent is a poor solvent to the organic semiconductor material, the alkyl chain contracts. In such extension and contraction of the alkyl chain, the alkyl chain is preferably contracted to reduce steric hindrance of the alkyl chain.

Accordingly, the organic solvent further preferably includes a substance whose second virial coefficient to the organic semiconductor material is smaller than that of cis-decalin. For example, when the repeating unit included in the organic semiconductor material includes an alkyl chain, the alkyl chain contracts, preventing the steric hindrance between adjacent molecules and alkyl chains and improving planarity of the molecule structure and packing density between molecules. As a result, carrier mobility of the organic semiconductor layer can be increased. Then, for example, if a thin-film transistor including such an organic semiconductor layer is manufactured, the thin-film transistor obtained is superior in characteristics and durability.

Examples of the substance whose second virial coefficient to the organic semiconductor material is smaller than that of cis-decalin are trans-decalin, cyclohexane and the like. They can be used singly or in combination of two or more of them.

In the groups of the substances described above, trans-decalin (trans-decahydronaphthalene) is particularly preferable. Trans-decalin has a structure shown in FIG. 4B, and is one of geometric isomers of decalin (decahydronaphthalene). Such trans-decalin has a smaller second virial coefficient to the organic semiconductor material than that of cis-decalin, and high compatibility with cis-decalin. Therefore, stability of the organic semiconductor composition is maintained for a long period of time while crystalline of the organic semiconductor layer is increased, improving carrier mobility.

Here, the volume ratio of cis-decalin to trans-decalin is preferably from 3:7 to 7:3, more preferably from 3.5:6.5 to 4.5:5.5. Accordingly, stability of the organic semiconductor composition is more highly maintained for a long period of time, particularly carrier mobility is improved. As a result, for example, if a thin-film transistor including such an organic semiconductor layer is manufactured, the thin-film transistor is superior in characteristics and durability.

In addition, it can be assessed that the steric hindrance between alkyl chains described above does not occur when the organic semiconductor material is dispersed or dissolved in various solvents having different second virial coefficients, and the peak wavelength of the absorption spectrum depends on a refractive index or dielectric constant of solvents rather than solubility thereof.

The second virial coefficient can be measured by a static light scattering photometer (SLS).

Here, the organic solvent can include a third substance other than cis-decalin or substances described above. Examples of the third substance are, cyclohexane, cyclohexanone, 1,4-dioxane, indane, indene, ethylnaphthalene, methylnaphthalene, benzofuran, trimethyl benzene, xylene, toluene, cyclohexylbenzene, chlorobenzene, dichlorobenzene, tetrahydronaphthalene, butane, hexane, heptane, octane, decane, dodecane, tetradecane, and hexadecane. By including the third substance and controlling its rate of content, solubility to the organic semiconductor material and stability of the organic semiconductor composition can be further improved.

Further, the organic solvent preferably includes 10 wt % or less of the third substance.

When the repeating unit included in the organic semiconductor material includes an alkyl chain, the alkyl chain preferably has a carbon number of from about 4 to about 20, more preferably from about 6 to about 10. The organic semiconductor material can thus maintain solubility to the organic solvent, making the length of the alkyl chain between the repeating units adjacent each other be about the length that is most unlikely to cause steric hindrance between alkyl chains. In addition, when the repeating unit includes a plurality of alkyl chains therein, the carbon number described above indicates the carbon number in a single alkyl chain. When the alkyl chain branches along the way, the carbon number indicates each of the carbon number of the alkyl chain from a base side binding to a main chain to each end of the alkyl chains branched.

Further, the structural unit including at least one thiophene ring described above preferably includes a Π conjugated structure on the main chain. The Π conjugated structure can prevent decrease of carrier mobility of molecules caused by inclusion of other structures than the one including at least one thiophene ring into the structural unit. Thereby, the carrier mobility of the organic semiconductor layer is prevented from decreasing.

Such a Π conjugated structure has a single bond and a double bond bound alternately. Examples of the Π conjugated structure are fluorine ring, pyrrole ring, aniline, carbazole, acethylene and the like. They can be used singly or in combination of two or more of them, however, in particular, fluorine ring is preferable to use. Fluorine ring has especially high carrier mobility, therefore, prevention of decreasing carrier mobility caused by fluorine ring is particularly ensured.

Further, the alkyl chain can be bound to thiophene ring, however, more preferably bound to a portion leading the alkyl chains above away from each other. This can avoid the alkyl chains from binding at least to thiophene ring, maintaining the structure of thiophene ring. Accordingly, semiconductor characteristics of thiophene ring are certainly prevented from decreasing.

A concrete example of the organic semiconductor material explained above is florene-bithiophene copolymer (F8T2) or the like as shown in Formula 1 below.

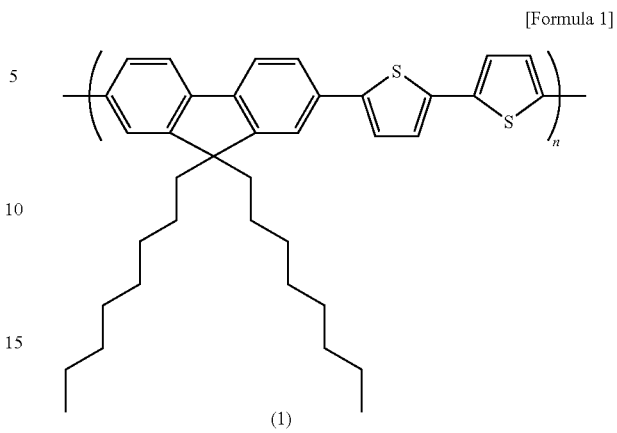

[Formula 1]

(1)

This F8T2 has relatively high ionization potential, thereby being hard to be oxidized by oxygen in the air or water. Therefore, the organic semiconductor material can include F8T2 as a main material, forming an organic semiconductor layer having a superior semiconductor characteristic that is hard to deteriorate over time.

Examples of other organic semiconductor materials are polymers like poly(3-alkylthiophene), shown in Formula 2 below, such as poly(3-hexyl thiophene) (P3HT) and poly (3-octylthiophene). They can be used singly or in combination with F8T2.

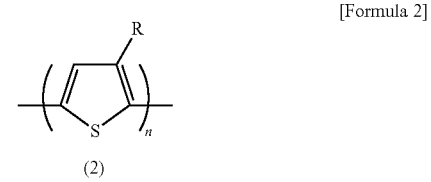

[Formula 2]

(2)

In the formula, R indicates an alkyl chain.

Further, other examples of the organic semiconductor material are compounds shown in Formulas 3 to 5. They can be used singly or in combination with F8T2.

[Formulas 3 to 5]

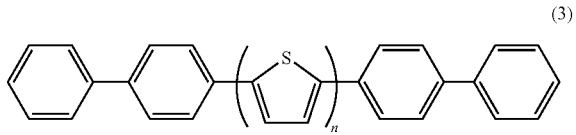

(3)

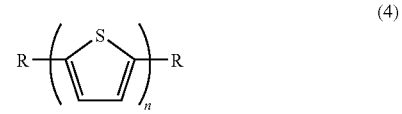

(4)

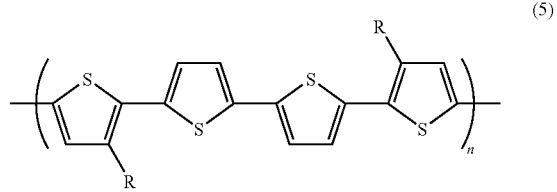

(5)

In the formula, R indicates an alkyl chain.

The average number n of the repeating unit in the organic semiconductor material is preferably from about 2 to about 500, more preferably from about 2 to about 100, and further preferably from about 4 to about 20. The organic semiconductor material can thus show sufficient characteristics as a semiconductor material while synthesizing and handling thereof are facilitated.

Further, the organic semiconductor composition preferably includes the organic semiconductor material from about 0.1 wt % to about 5 wt %, more preferably about 0.5 wt % to about 2 wt %. Accordingly, the organic semiconductor material is certainly prevented from precipitating while an organic semiconductor layer is formed to have a sufficient film thickness.

Next, the organic semiconductor composition stated above is provided on the substrate 10 so as to cover the source electrode and the drain electrode.

A liquid material for forming an organic semiconductor is provided on the substrate 10 by application methods such as spin coating and dipping, or printing methods such as inkjet printing and screen printing, for example.

The inkjet printing is preferable among them. The inkjet printing can provide a fine pattern with a liquid material without patterning, thereby forming an organic semiconductor layer in an accurate shape with a simple step.

Further, the organic solvent used for the organic semiconductor composition of the embodiment has a boiling point that is sufficiently higher than room temperature although it depends on the composition. Therefore, the liquid material is prevented from being dried on the surface of the nozzles, which is a drawback of the inkjet method, providing a good ejection characteristic.

Then, the organic semiconductor composition is annealed if it includes a precursor of the organic semiconductor material.

The organic semiconductor layer 30 is thus formed to cover the source electrode 20a and the drain electrode 20b. Here, a channel region is formed in between the source electrode 20a and the drain electrode 20b.

The area in which the organic semiconductor layer 30 is formed is not limited to what is described in the drawing. The organic semiconductor layer 30 may be selectively formed only in a region (channel region) between the source electrode 20a and the drain electrode 20b. When more than one thin-film transistor 1 (element) is provided on the same substrate, this structure makes it possible to form the organic semiconductor layer 30 of each element independently, and thereby reducing leak current and crosstalk among the elements. In addition, this also reduces the amount of the organic semiconductor material to be used, and thereby cutting manufacturing cost.

[A3] Step for Forming the Gate Insulation Layer

Figure 3C:
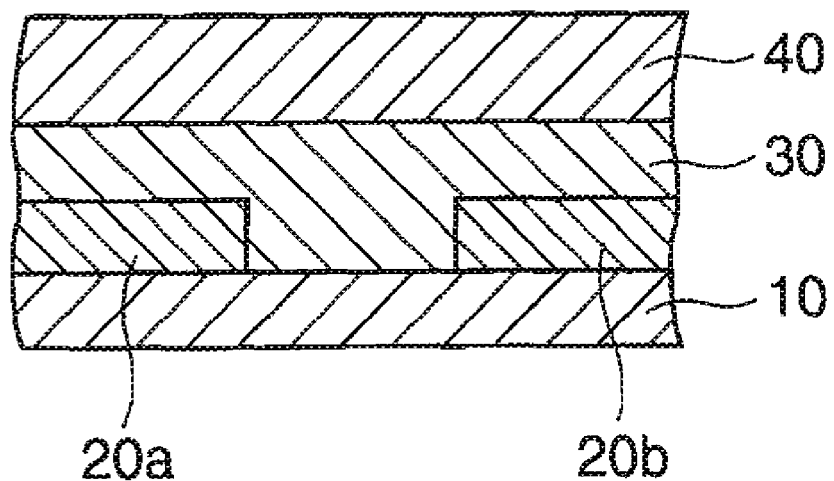
FIGS. 3C and 3D are cross sectional views explaining the method for manufacturing the thin-film transistor shown in FIGS. 1A and 1B.
Figure 4A:
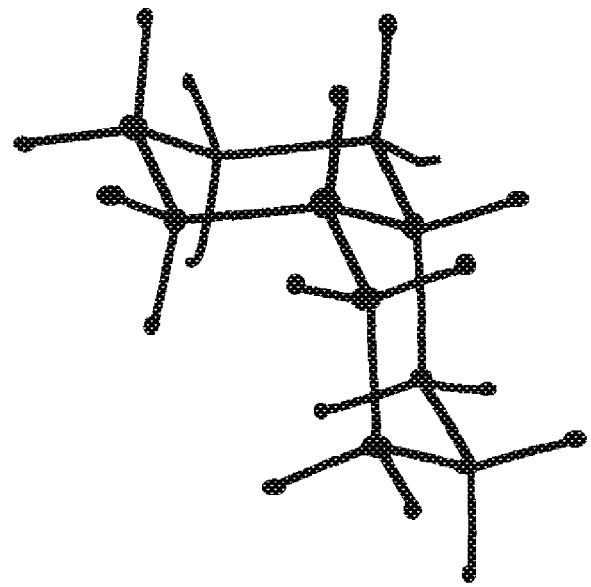
FIGS. 4A and 4B are schematic views showing three-dimensional structures of cis-decalin and trans-decalin.
Figure 4B:
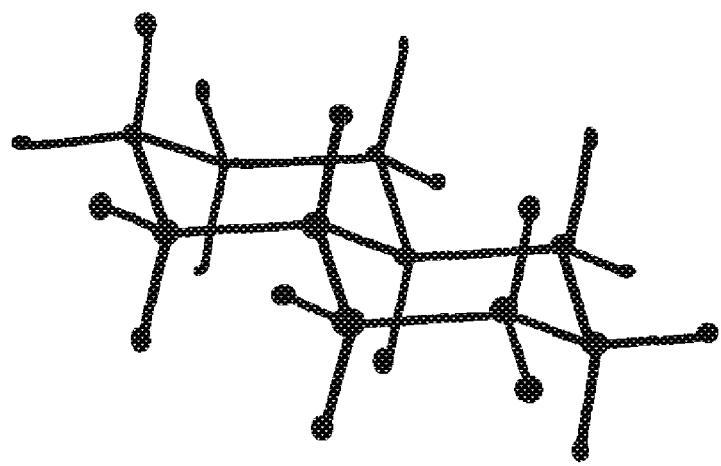

Next, the gate insulation layer 40 is formed on the organic semiconductor layer 30 as shown in FIG. 3C.

For example, when the gate insulation layer 40 is made of an organic polymer material, the layer 40 is formed by applying (or providing) the organic polymer material or a solution containing its precursor so as to cover the organic semiconductor layer 30, and then a necessary treatment (e.g. heating, irradiation of infrared rays, application of ultrasonic waves) is provided thereto.

The organic polymer material or the solution containing its precursor is applied (or provided) to the surface of the organic semiconductor layer 30 by the application and printing methods described in the step [A2].

The gate insulation layer 40 may also be formed with an inorganic material by thermal oxidation, CVD, or spin-on glass (SOG). It is possible to form a silica film and a silicon nitride film as the gate insulation layer 40 through wet processing using polysilazane as the material.

[A44] Step for Forming the Gate Electrode

Figure 3D:
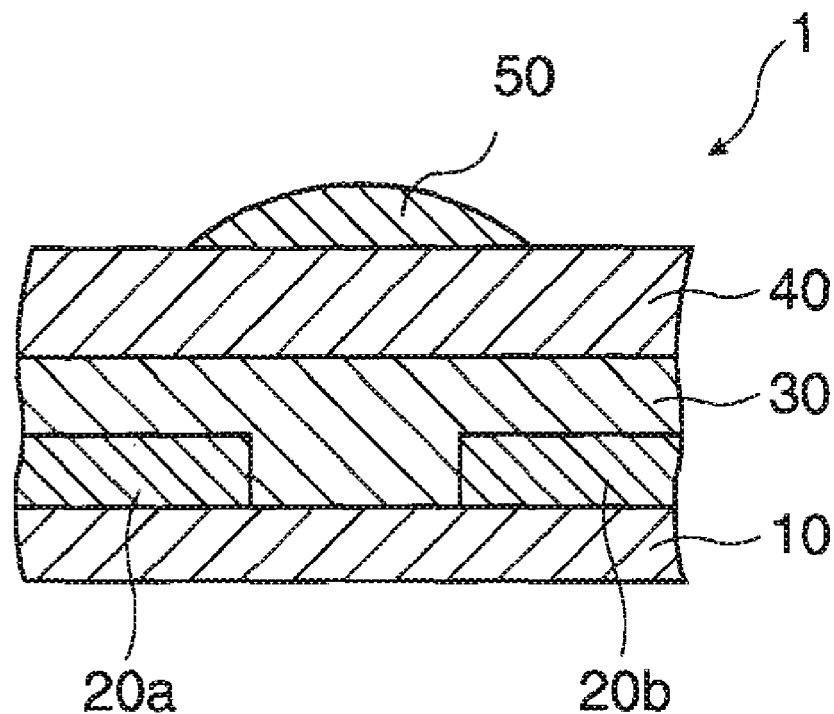

Next, the gate electrode 50 is formed on the gate insulation film 40 as shown in FIG. 3D.)

First, a metal film (a metal layer) is formed prior to forming the gate electrode 50.

This formation can be achieved by the following methods, for example: chemical vapor deposition (CVD) including plasma CVD, thermal CVD, and laser CVD; vacuum deposition; sputtering (low-temperature sputtering); dry plating such as ion plating; wet plating including electrolytic plating, immersion plating, and electroless plating; spraying; sol-gel processing; metalorganic deposition; and joining of metal foil.

A resist material is applied to the metal film, and cured, forming the resist layer having the shape corresponding to the gate electrode 50. Unnecessary portions of the metal film are removed by using the resist layer as a mask.

This metal film can be removed by the following methods; a physical method such as plasma etching, reactive ion etching, beam etching, photo assist etching; a chemical etching such as wet etching. They can be used singly or in combination.

Then, the gate electrode 50 is obtained by removing the resist layer.

The gate electrode 50 may be formed by applying (or providing), for example, conductive particles, and a conductive material including a conductive organic material on the gate insulation layer 40 to form a coated film and then a necessary treatment (e.g. heating, irradiation of infrared rays, application of ultrasonic waves) is provided thereto.

As the conductive material containing conductive particles, solutions in which metal micro particles are dispersed and polymer mixtures containing conductive particles are cited.

Examples of the conductive material containing a conductive organic material include a solution or dispersion liquid of the conductive organic material.

The conductive material is applied (or provided) to the surface of the gate insulation layer 40 by the application and printing methods described in the step [A2].

The thin-film transistor 1 of the first embodiment can be formed by the process described above.

Second Embodiment

Next, a second embodiment of the thin-film transistor manufactured by using the organic semiconductor composition is explained.

Figure 5:
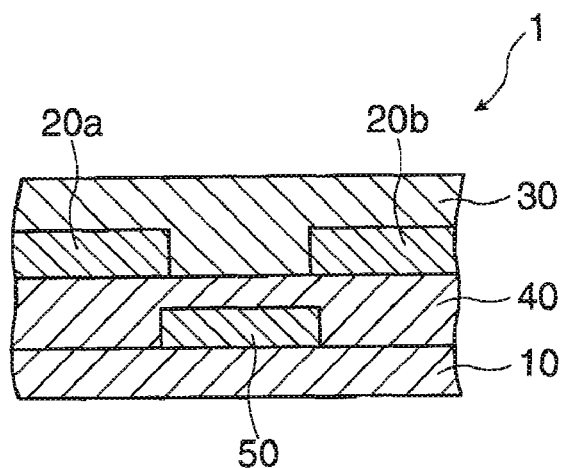
FIG. 5 is a sectional view schematically showing a second embodiment of the thin-film transistor manufactured by using the organic semiconductor composition of the invention.

FIG. 5 is a sectional view schematically showing the second embodiment of the thin-film transistor manufactured by using the organic semiconductor composition.

The difference of the second embodiment from the first embodiment will be mainly explained, and the same contents of them are omitted.

A position where each electrode is aligned in the second embodiment is different from the first one. However, other than that is the same as that in the first embodiment.

As shown in FIG. 5, the thin-film transistor 1 is a bottom gate type thin-film transistor in which the gate electrode 50 is located on the substrate 10 side via the gate insulation layer 40 far from the source electrode 20a and the drain electrode 20b.

The organic semiconductor layer 30 is formed by using the same organic semiconductor composition as that in the first embodiment.

The thin-film transistor 1 is formed by a method similar to the method described in the first embodiment.

The thin-film transistor 1 of the second embodiment has functions and effects similar to those of the first embodiment.

Here, the electronic device including an organic semiconductor layer formed by the organic semiconductor composition of the invention is not limited to a thin-film transistor, and may be an organic EL element, a photo electron conversion element or the like.

[Electro Optic Device]

Next, a display equipped with an active matrix device (a substrate provided with an electronic device) having the thin-film transistor 1 will now be described. Here, an electrophoretic display device is given as an example. A method for manufacturing the active matrix device is to form a plurality of thin-film transistors 1 on the substrate 10 by the method for manufacturing the thin-film transistor 1 described above.

Figure 6:
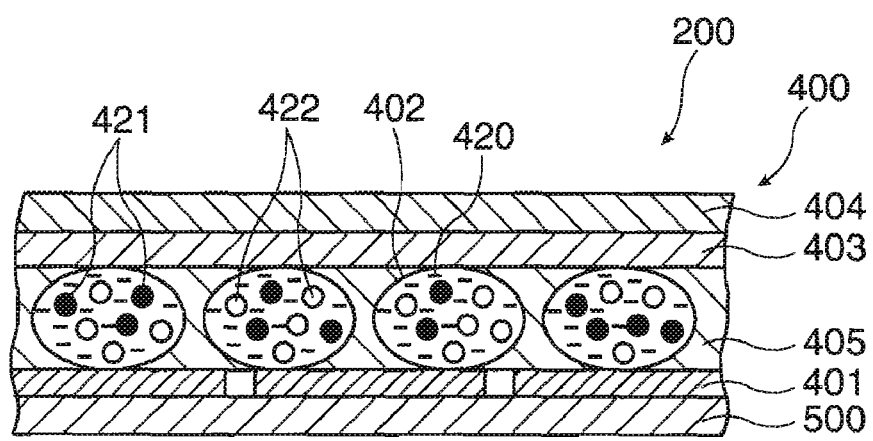
FIG. 6 is a cross sectional view of the electrophoretic display of another embodiment.
Figure 7:
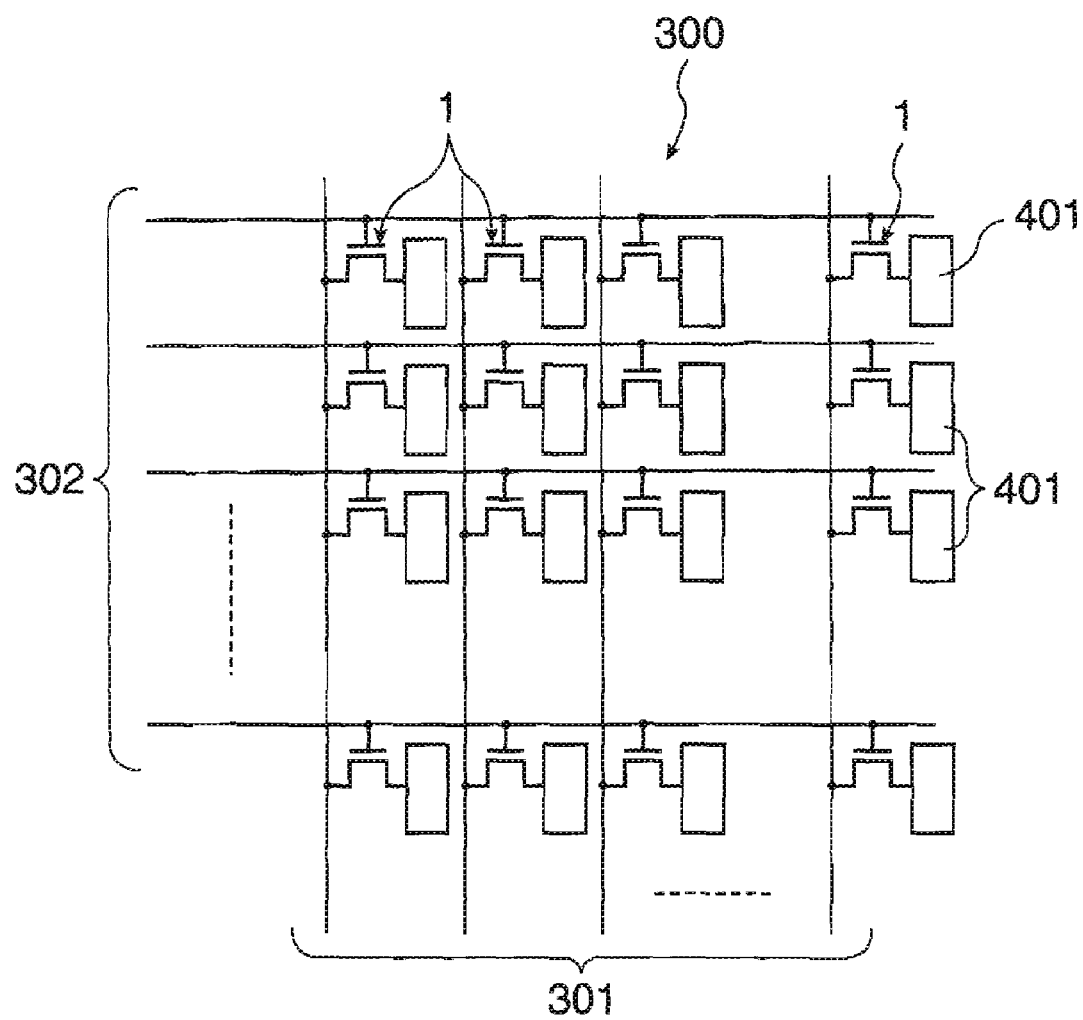
FIG. 7 is a block diagram showing a structure of an active matrix device included in the electrophoretic display device shown in FIG. 6.

FIG. 6 is a cross sectional view of an embodiment of the electrophoretic display, and FIG. 7 is a block diagram showing the active matrix device included in the electrophoretic display shown in FIG. 6.

An electrophoretic display 200 shown in FIG. 6 includes an active matrix device 300 formed on a substrate 500 and an electrophoretic display portion 400 electrically connected to the active matrix device 300.

As shown in FIG. 7, the active matrix device 300 includes a plurality of data lines 301, a plurality of scanning lines 302, which are mutually-perpendicular, and the thin-film transistor 1 which is installed about each of the intersection points of these data lines 301 with the scanning lines 302.

The gate electrode 50 included in each of the thin-film transistor 1 is connected to the scanning line 302, the source electrode 20a is connected to the data line 301 and the drain electrode 20b is connected to a pixel electrode (an individual electrode) 401 described later.

As shown in FIG. 6, the electrophoretic display portion 400 includes the pixel electrode 401, a micro capsule 402, a transparent electrode (a common electrode) 403 and a transparent substrate 404 which are sequentially deposited on the substrate 500.

The micro capsule 402 is fixed between the pixel electrode 401 and the transparent electrode 403 by a binder member 405.

The pixel electrode 401 is divided as being regularly arranged in a matrix.

Each capsule 402 includes an electrophoretic dispersion liquid 420 that includes a plurality of electrophoretic particles having different characteristics. In this embodiment, two kinds of electrophoretic particles having different charges and colors (color phases), namely, electrophoretic particles 421 and 422, are encapsulated.

In the electrophoretic display device 200, when a selection signal (selection voltage) is supplied to one or more of the scanning lines 302, the thin-film transistor 1 that is coupled to the scanning lines 302 supplied with the selection signal (selection voltage) turns ON.

This switching makes data lines 301 coupled to the thin-film transistor 1 be electrically connected to the pixel electrode 401. Here, if certain data (voltage) are supplied to the data lines 301, the data (voltage) are supplied to the pixel electrode 401.

This supplying data voltage generates an electric field between the pixel electrode 401 and the transparent electrode 403. The electrophoretic particles 421 and 422 move electrophoretically in a direction toward either electrode depending on the direction and strength of the electric field, and properties of the electrophoretic particles 421 and 422.

Meanwhile, if the supply of a selection signal (selection voltage) to the scanning lines 302 is stopped, the thin-film transistor 1 turns OFF, cutting off the electrical connection between the data lines 301 and the pixel electrode 401 coupled to the thin-film transistor 1.

Accordingly, by supplying or stopping the selection signal to the scanning lines 302 and by supplying or stopping data to the data lines 301 in appropriate combination, a desirable image (information) is displayed on a display side (the transparent substrate 404 side) of the electrophoretic display device 200.

In particular, in the electrophoretic display device 200 of the embodiment, the electrophoretic particles 421 and 422 have different colors each other, making it possible to display multiple grayscale images.

Also, the electrophoretic display device 200 has the active matrix device 300, selectively and certainly turning ON and OFF the thin-film transistor 1 coupled to the specific scanning line 302. Such a structure avoids a cross talk, and increases the speed of circuit operation, improving the quality of images (information).

Moreover, the electrophoretic display device 200 of the embodiment operates at a low driving voltage and saves electric power.

Here, such an electro optical device described above in which the active matrix device is provided with the thin-film transistors 1 is applied not only to the above electrophoretic display 200, but to displays such as a liquid crystal device, an organic or inorganic EL device and a light emission device.

This method for manufacturing an electro optical device (the method for manufacturing an electro optical device of the invention), for example, in the case of the method for manufacturing an electrophoretic display described above, includes a manufacturing step to attach an active matrix device to a so-called electrophoretic display sheet having the micro capsule 402 fixed to the transparent electrode 403 by the binder 405. Further, in the case of a liquid crystal device, for example, the method for manufacturing it includes a manufacturing step to fill an liquid crystal material into the gap between the active matrix device and a substrate faced thereto attached together.

[Electronic Apparatus]

The electrophoretic display 200 can be incorporated into various electronic apparatuses. The electronic apparatuses provided with the electrophoretic display 200 will be described below.

[Electronic Paper]

First, another embodiment in which the electronic apparatus is applied to an electronic paper will be described.

Figure 8:
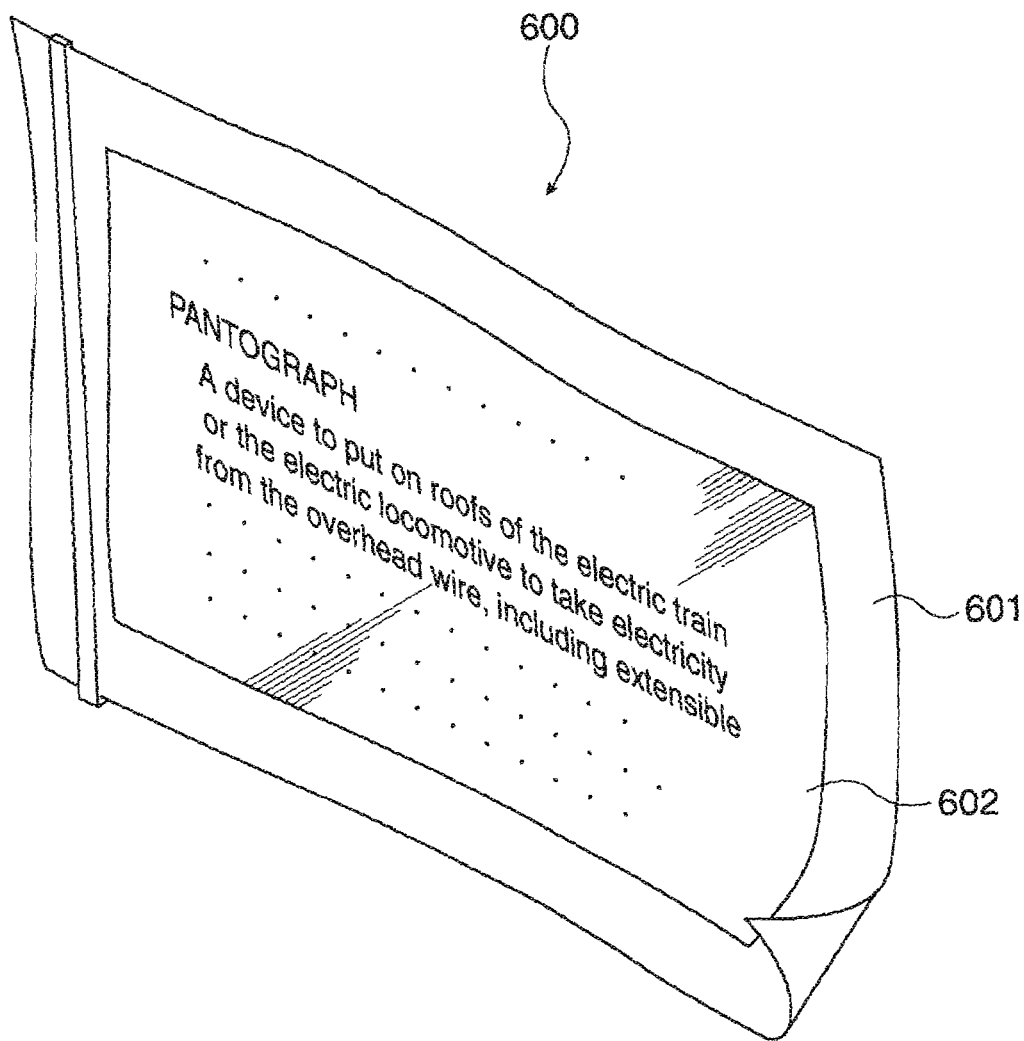
FIG. 8 is a perspective view showing yet another embodiment where an electronic apparatus is applied to an electronic paper.

FIG. 8 is a perspective view showing the embodiment where the electronic apparatus is applied to an electronic paper.

In this figure, an electronic paper 600 includes a body 601 and a display unit 602. The body 601 is made of a rewritable sheet having a texture and flexibility like paper.

In the electronic paper 600, the display unit 602 includes the electrophoretic display 200.

[Display]

Next, another embodiment in which the electronic apparatus is applied to a display will be described.

Figure 9A:
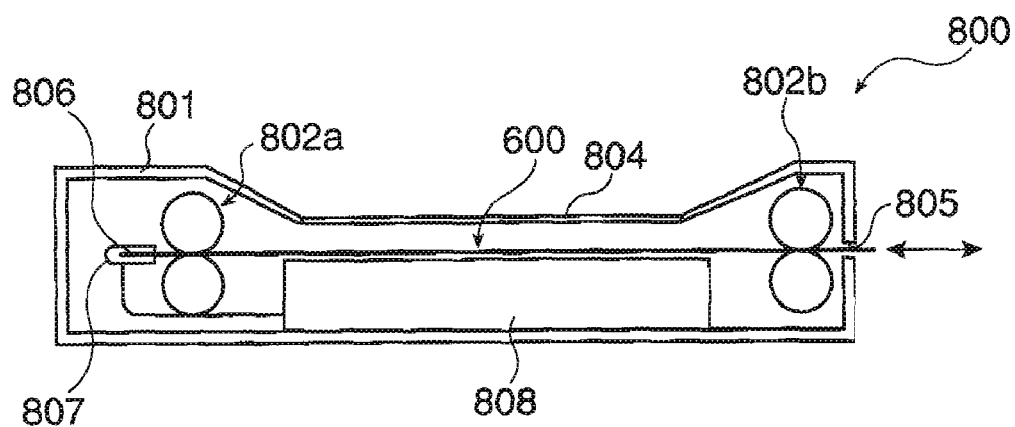
FIGS. 9A and 9B are diagrams showing still another embodiment where the electronic apparatus is applied to a display.
Figure 9B:
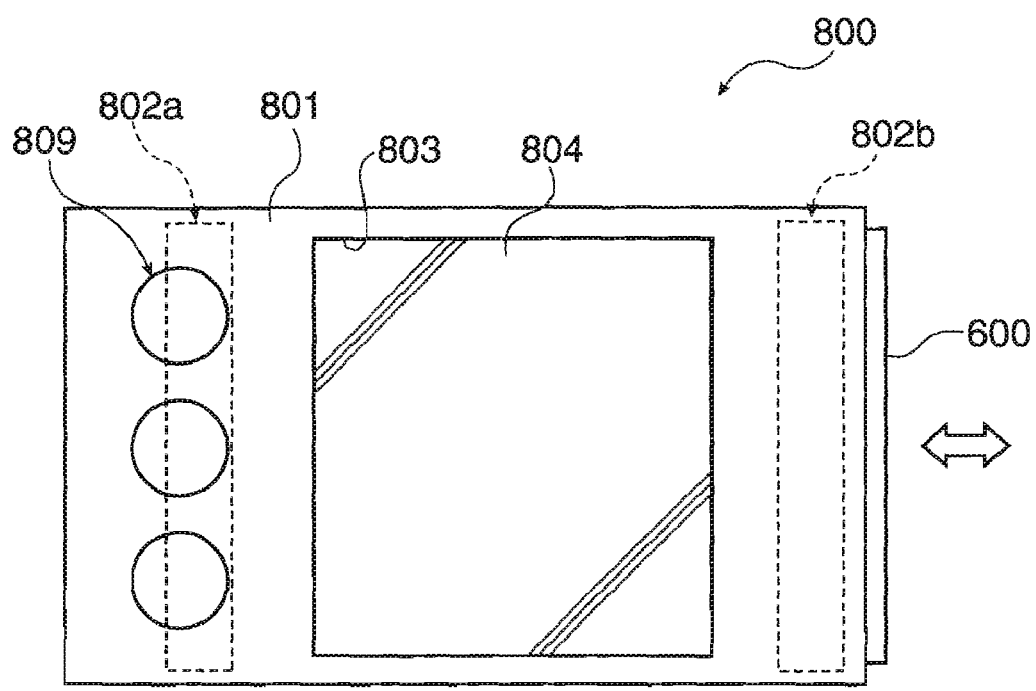

FIGS. 9A and 9B are diagrams showing the embodiment where the electronic apparatus is applied to a display. FIG. 9A shows a sectional view while FIG. 9B shows a plan view.

In this figure, a display 800 includes a body 801 and the electronic paper 600 that is detachably provided to the body 801. The electronic paper 600 has the above-mentioned structure, that is, the one shown in FIG. 8.

The body 801 has an insertion slot 805 on its side (right in the figure) into which the electronic paper 600 is insertable. The body 801 also has a pair of feed rollers 802a and 802b inside. When the electronic paper 600 is inserted through the insertion slot 805 into the body 801, the electronic paper 600 is fed into the body 801, being sandwiched by the pair of feed rollers 802a and 802b.

The body 801 also has an opening 803 in a rectangular shape on the display side of the body 801 (front side in FIG. 9B). A transparent glass plate 804 is fitted in the opening 803. Accordingly, the electronic paper 600 fed into the body 801 is visible from the outside of the body 801. In other words, the display 800 has a display by making the electronic paper 600 fed into the body 801 visible through the transparent glass plate 804.

Also, a terminal 806 is provided at an end in the direction toward which the electronic paper 600 is inserted (left in the figure). Inside the body 801, the terminal 806 is coupled to a socket 807 with the electronic paper 600 being fed into the body 801. The socket 807 is electrically coupled to a controller 808 and a control part 809.

In this display 800, the electronic paper 600 is detachably fed into the body 801, and can be used out of the body 801 for portable use.

In the display 800, the electronic paper 600 includes the electrophoretic display 200 described above.

Examples of the electronic apparatus are not limited to the above-mentioned, and include TV sets, view finder type video tape recorders, monitor direct view type video tape recorders, car navigation systems, pagers, electronic notebooks, calculators, electronic newspapers, word processors, personal computers, workstations, videophones, point-of-sale devices, touch-sensitive panel devices, and so on, The electrophoretic display 200 is applicable to the display for various types of these electronic apparatuses.

Exemplary embodiments of the invention with respect to the method for manufacturing an organic semiconductor composition and a transistor, the method for manufacturing an active matrix device, the method for manufacturing an electro optical device and the method for manufacturing an electronic apparatus have been described above. However, the invention is not limited to these.

For example, each of components of the transistor, the active matrix device, the electro optical device and the electronic apparatuses manufactured by each method of the embodiments can be substituted by a given element that has a function of similar to the above-mentioned, and a given structure may be added to the above-mentioned.

EXAMPLES

Specific examples of the invention will now be described.
Preparing liquid materials (organic semiconductor compositions of the invention)
Liquid materials No. 1 to 48 were prepared as described below.

Example A

Liquid material No. 1
Florene-bithiophene copolymer (F8T2) was dispersed or dissolved at a ratio of 1 wt % to a mixed solvents in which the ratio of cyclohexane to cis-decalin was 85 wt %:15 wt %.
Liquid materials No. 2 to 24
In these examples, mixed solvents to disperse and dissolve F8T2 were changed as shown in Table 1. Except for such changes, the same process for Liquid material No. 1 was applied to prepare the liquid materials.
Comparison A
Liquid materials No. 25 to 48
In these examples, F8T2 was mixed into organic solvents shown in Table 2. Except for such changes, the same process for Liquid material No. 1 was applied to prepare the liquid materials.
1-2. Evaluation
Each liquid material was left at room temperature and the time that F8T2 was precipitated was measured.
The results of the measurements are listed in Tables 1 and 2.

TABLE 1

| Liquid material No. | Solvent | | | | Precipitation time |
|---|---|---|---|---|---|
| | Type | Rate of content [wt %] | Type | Rate of content [wt %] | |
| 1. Example A | cyclohexane | 85 | cis-decalin | 15 | several days |
| 2. Example A | cyclohexanone | 85 | cis-decalin | 15 | several days |
| 3. Example A | 1,4-dioxane | 85 | cis-decalin | 15 | several days |
| 4. Example A | indane | 85 | cis-decalin | 15 | several days |
| 5. Example A | indene | 85 | cis-decalin | 15 | several days |
| 6. Example A | ethylnaphthalene | 85 | cis-decalin | 15 | several days |
| 7. Example A | methylnaphthalene | 85 | cis-decalin | 15 | several days |
| 8. Example A | benzofuran | 85 | cis-decalin | 15 | several days |
| 9. Example A | trimethyl benzene | 85 | cis-decalin | 15 | several days |
| 10. Example A | xylene | 85 | cis-decalin | 15 | several days |
| 11. Example A | toluene | 85 | cis-decalin | 15 | several days |
| 12. Example A | cyclohexylbenzene | 85 | cis-decalin | 15 | several days |
| 13. Example A | chlorobenzene | 85 | cis-decalin | 15 | several days |
| 14. Example A | dichlorobenzene | 85 | cis-decalin | 15 | several days |
| 15. Example A | tetrahydronaphthalene | 85 | cis-decalin | 15 | several days |
| 16. Example A | butane | 85 | cis-decalin | 15 | 0.5 hours |
| 17. Example A | hexane | 85 | cis-decalin | 15 | 0.5 hours |
| 18. Example A | heptane | 85 | cis-decalin | 15 | 0.5 hours |
| 19. Example A | octane | 85 | cis-decalin | 15 | 0.5 hours |
| 20. Example A | decane | 85 | cis-decalin | 15 | 0.5 hours |
| 21. Example A | dodecane | 85 | cis-decalin | 15 | 0.5 hours |
| 22. Example A | tetradecane | 85 | cis-decalin | 15 | 0.5 hours |
| 23. Example A | hexadecane | 85 | cis-decalin | 15 | 0.5 hours |
| 24. Example A | trans-decalin | 85 | cis-decalin | 15 | 6 months or more |

TABLE 2

| Liquid material No. | Solvent | Precipitation time (Dissolving state of F8T2) |
|---|---|---|
| 25. Comparison A | cyclohexane | several tens of seconds |
| 26. Comparison A | cyclohexanone | several tens of seconds |
| 27. Comparison A | 1,4-dioxane | hardly dissolved |
| 28. Comparison A | indane | several minutes |
| 29. Comparison A | indene | several minutes |
| 30. Comparison A | ethylnaphthalene | several minutes |
| 31. Comparison A | methylnaphthalene | several tens of minutes |
| 32. Comparison A | benzofuran | several tens of minutes |
| 33. Comparison A | trimethyl benzene | overnight |
| 34. Comparison A | xylene | several hours |
| 35. Comparison A | toluene | several hours |
| 36. Comparison A | cyclohexylbenzene | several hours |
| 37. Comparison A | chlorobenzene | several days |
| 38. Comparison A | dichlorobenzene | several days |
| 39. Comparison A | tetrahydronaphthalene | several days |
| 40. Comparison A | butane | hardly dissolved |
| 41. Comparison A | hexane | hardly dissolved |
| 42. Comparison A | heptane | hardly dissolved |
| 43. Comparison A | octane | hardly dissolved |
| 44. Comparison A | decane | hardly dissolved |
| 45. Comparison A | dodecane | hardly dissolved |
| 46. Comparison A | tetradecane | hardly dissolved |
| 47. Comparison A | hexadecane | hardly dissolved |
| 48. Comparison A | trans-decalin | one month |

As shown in Tables 1 and 2, it was revealed that each of Liquid materials No. 1 to 24 (Example A) had a longer time for precipitation of F8T2 and was highly stable compared to Liquid materials No. 25 to 48 (Comparison A) made by excluding cis-decalin from Liquid materials No. 1 to 24.

In particular, F8T2 hardly dissolved in Liquid materials No. 27 and from No. 40 to 47 in Comparison A shown in Table 2. However, by adding cis-decalin to each organic solvent, F8T2 dissolved in Liquid materials No. 3 and from No. 16 to 23 of Example A shown in Table 1. This further proves the effectiveness of cis-decalin to improve solubility.

2-1. Manufacturing Thin-Film Transistors

Example B

Thin-film transistors of Samples No. 1 to 11 were manufactured for 200 pieces each as described below.

Sample No. 1

First, a glass substrate (NEC Corning incorporated-made "OA10") was prepared, cleaned with water and dried.

Next, a resist layer was formed on the glass substrate by photolithography on a region except the regions for forming the source electrode and the drain electrode.

Then, a gold thin-film was formed by evaporation on the surface of the glass substrate, which was a side of the resist layer. Then the resist layer was removed.

This process formed the source electrode and the drain electrode having an average thickness of 100 nm.

Next, the surface of the glass substrate, which was a side of the source and drain electrodes formed, was treated with oxygen plasma.

The conditions of the oxygen plasma treatment were the followings:
Introduced gas: Pure oxygen gas
Amount of gas flow: 100 sccm
RF power: 0.05 W/cm$^2$
Treatment period: Three hundred seconds
Atmospheric temperature: 25° C.
Atmospheric pressure: $1*10^{-1}$ Pa The distance (the channel length) between the source electrode and the drain electrode was 20 μm and the channel width was 1 mm.

Then, florene-bithiophene copolymer (F8T2) having a molecular weight in a range from about 5000 to about 15000 was dispersed or dissolved at a rate of 1.1 wt % in a mixed solvent in which the volume ratio of cis-decalin to trans-decalin was 20:80 to prepare the organic semiconductor composition. The organic semiconductor composition was applied on the glass substrate by spin coating at 2400 rpm for 60 seconds, and then the substrate was dried at 60 degrees centigrade for 10 minutes.

The process formed the organic semiconductor layer having an average thickness of 50 nm.

Subsequently, a 5% wt butyle acetate solution of polymethyl methacrylate (PMMA) was applied on the organic semiconductor layer by spin coating at 2400 rpm for 60 seconds, and the layer was dried at 60 degrees centigrade for 10 minutes. Subsequently, a 2% wt/vol butanol solution of polyvinyl phenol (PVP) was applied on the above treated layer by spin coating at 2400 rpm for 60 seconds, and the layer was dried at 60 degrees centigrade for 10 minutes.

This process formed a gate insulation layer having a double-layer structure and an average thickness (in total) of 500 nm.

Next, an Ag micro particles dispersed liquid was applied by an inkjet method to the region on the gate insulation layer corresponding to the region between the source and the drain electrodes, and then the substrate was dried at 80 degrees centigrade for 10 minutes.

This process formed the gate electrode of which an average thickness was 100 nm and an average width was 30 μm.

Sample No. 1 of the thin-film transistor was obtained as above.

Samples No. 2 to 5

In these examples, the organic solvents for the organic semiconductor compositions were changed as shown in Table 3. Except for such changes, the same process for Sample No. 1 was applied to form the thin-film transistors.

Comparison B

Samples No. 6 to 11

In these examples, the organic solvents of the liquid materials for the organic semiconductor compositions were changed as shown in Table 3. Except for such changes, the same process for Sample No. 1 was applied to form the thin-film transistors.

2-2. Evaluation

An S value for each Sample No. of the thin-film transistors was measured under a nitrogen atmosphere.

Here, the S value is a gate voltage required to add a drain current value to the next digit.

The results of the measurements are listed in Table 3.

Every value in Table 3 is an average of two hundreds thin-film transistors.

TABLE 3

| | Solvent | | | | S value |
|---|---|---|---|---|---|
| Sample No. | Type | Rate of content [wt %] | Type | Rate of content [wt %] | [V] |
| 1. Example B | cis-decalin | 20 | trans-decalin | 80 | 1.8 |
| 2. Example B | cis-decalin | 40 | trans-decalin | 60 | 1.4 |

TABLE 3-continued

| Sample No. | Solvent | | | | S value [V] |
|---|---|---|---|---|---|
| | Type | Rate of content [wt %] | Type | Rate of content [wt %] | |
| 3. Example B | cis-decalin | 50 | trans-decalin | 50 | 1.7 |
| 4. Example B | cis-decalin | 80 | trans-decalin | 20 | 2.1 |
| 5. Example B | cis-decalin | 40 | cyclohexane | 60 | 2.2 |
| 6. Comparison B | trans-decalin | 100 | — | — | 2.3 |
| 7. Comparison B | tetrahydrofuran | 100 | — | — | 3.7 |
| 8. Comparison B | chloroform | 100 | — | — | 4.6 |
| 9. Comparison B | chlorobenzene | 100 | — | — | 2.4 |
| 10. Comparison B | toluene | 100 | — | — | 2.9 |
| 11. Comparison B | tetralin | 100 | — | — | 2.4 |

As shown in Table 3, Samples No. 1 to 5 (Example B) had good transistor characteristics as the S values thereof were lower in whole than those of Samples No. 6 to 11 (Comparison B). Further Sample No. 2 had an especially low S value. Hence, the organic solvent of the organic semiconductor composition includes trans decalin, improving transistor characteristics. Further, it was found that the advantage was even remarkable when cis-decalin and trans-decalin in the organic solvent were dissolved at a certain ratio.

The entire disclosures of Japanese Patent Application No. 2005-376311, filed Dec. 27, 2005, and of Japanese Patent Application No. 2006-286722, filed Oct. 20, 2006 are expressly incorporated by reference herein.

What is claimed is:

1. An organic semiconductor composition, comprising:
    an organic semiconductor material having a structural unit including at least one thiophene ring as a repeating unit; and
    an organic solvent including cis-decalin, wherein the organic solvent includes 15 wt % or more cis-decalin.

2. The organic semiconductor composition according to claim 1, further comprising:
    a substance whose second virial coefficient to the organic semiconductor material is smaller than a second virial coefficient of cis-decalin.

3. The organic semiconductor composition according to claim 2, wherein the substance is trans-decalin.

4. The organic semiconductor composition according to claim 3, wherein a volume ratio of cis-decalin to trans-decalin in the organic solvent is from 3:7 to 7:3.

5. The organic semiconductor composition according to claim 1, wherein the structural unit includes a Π conjugated structure on a main chain.

6. The organic semiconductor composition according to claim 5, wherein the Π conjugated structure is a fluorine ring.

7. The organic semiconductor composition according to claim 6, wherein the structural unit includes an alkyl chain bound to the fluorine ring.

8. The organic semiconductor composition according to claim 1, wherein the structural unit includes an alkyl chain.

9. The organic semiconductor composition according to claim 7, wherein the alkyl chain includes carbon numbers of from 4 to 20.

10. The organic semiconductor composition according to claim 1, wherein the organic semiconductor material includes numbers of the repeating unit of from 2 to 500 in average.

11. The organic semiconductor composition according to claim 1, wherein the organic semiconductor composition includes 0.1 wt % to 5 wt % of the organic semiconductor material.

* * * * *